(12) United States Patent
Kiehlbauch (10) Patent No.: US 7,977,727 B2
(45) Date of Patent: Jul. 12, 2011

(54) SEMICONDUCTOR CONSTRUCTIONS

(75) Inventor: Mark Kiehlbauch, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/687,735

(22) Filed: Jan. 14, 2010

(65) Prior Publication Data

US 2010/0109127 A1      May 6, 2010

Related U.S. Application Data

(62) Division of application No. 11/851,484, filed on Sep. 7, 2007, now Pat. No. 7,670,905.

(51) Int. Cl.
*H01L 29/788* (2006.01)
(52) U.S. Cl. .................. 257/315; 257/E29.3
(58) Field of Classification Search .......... 438/182, 438/201, 257, 427; 257/E21.027, E29.3, 257/315–323
See application file for complete search history.

(56) References Cited

U.S. PATENT DOCUMENTS

| | | | |
|---|---|---|---|
| 4,962,054 A * | 10/1990 | Shikata | 438/179 |
| 5,596,207 A | 1/1997 | Krishnan et al. | |
| 5,739,052 A * | 4/1998 | Krishnan et al. | 438/17 |
| 5,980,768 A * | 11/1999 | Abraham | 216/67 |
| 6,316,169 B1 | 11/2001 | Vahedi et al. | |
| 6,583,008 B2 | 6/2003 | Lee et al. | |
| 7,018,780 B2 | 3/2006 | Vahedi et al. | |
| 7,018,868 B1 | 3/2006 | Yang et al. | |
| 7,129,140 B2 | 10/2006 | Chen et al. | |
| 7,244,334 B2 | 7/2007 | Buxbaum et al. | |
| 2006/0040504 A1 | 2/2006 | Crawford et al. | |
| 2006/0273456 A1 | 12/2006 | Sant et al. | |
| 2006/0281266 A1 | 12/2006 | Wells | |
| 2007/0049030 A1 | 3/2007 | Sandhu et al. | |
| 2007/0117310 A1 | 5/2007 | Bai et al. | |
| 2007/0117399 A1 | 5/2007 | Del Puppo et al. | |

FOREIGN PATENT DOCUMENTS

KR    10-1999-0057052    7/1999

(Continued)

OTHER PUBLICATIONS

Sengo, G. et al., "Metal mask free dry-etching process for integrated optical devices applying highly photostabilized resist" Proceedings Symposium IEEE/LEOS Benelux Chapter, 2006, Eindhoven, pp. 109-112.

(Continued)

*Primary Examiner* — Matthew Smith
*Assistant Examiner* — Daniel Shook
(74) *Attorney, Agent, or Firm* — Wells St. John P.S.

(57) ABSTRACT

Some embodiments include methods of reflecting ions off of vertical regions of photoresist mask sidewalls such that the ions impact foot regions along the bottom of the photoresist mask sidewalls and remove at least the majority of the foot regions. In some embodiments, trenches may be formed adjacent the photoresist mask sidewalls in a material that is beneath the photoresist mask. Another material may be formed to have projections extending into the trenches. Such projections may assist in anchoring said other material to the material that is beneath the photoresist mask. In some embodiments, the photoresist mask is utilized for patterning flash memory structures. Some embodiments include semiconductor constructions having materials anchored to underlying materials through fang-like projections.

9 Claims, 13 Drawing Sheets

FOREIGN PATENT DOCUMENTS

WO PCT/US2008/072513     2/2009

OTHER PUBLICATIONS

Clarycon, Plasma Technology for Advanced Devices, "Trenching" printed Sep. 20, 2007 http://www.clarycon.com/trenching2(plasm.html.

Hoekstra, Robert J. et al., "Microtrenching resulting from specular reflection during chlorine etching of silicon" J. Vac. Sci. Technol. B 16(4), Jul./Aug. 1998 Copyright 1998 American Vacuum Society, pp. 2102-2104.

Mar. 18, 2010 International Preliminary Report on Patentability for corresponding PCT/US2008/072513.

* cited by examiner

SEMICONDUCTOR CONSTRUCTIONS

RELATED PATENT DATA

This patent resulted from a divisional of U.S. patent application Ser. No. 11/851,484, which was filed Sep. 7, 2007, and which is hereby incorporated herein by reference.

TECHNICAL FIELD

Semiconductor constructions, semiconductor processing methods, and methods of forming flash memory structures.

BACKGROUND

Photolithographic processing is commonly utilized for patterning materials during semiconductor processing. In photolithographic processing, photoresist is exposed to patterned radiation and then developed to form a patterned photoresist mask. The pattern of the photoresist mask may be subsequently transferred to underlying materials with one or more suitable etches. Alternatively, or additionally, the photoresist mask may be utilized to block a portion of the underlying substrate during implant of dopant into the substrate.

It is often desired to form the patterned photoresist mask to have vertical sidewalls extending from the underlying substrate. A problem that may occur during photolithographic processing is that the sidewalls may only be vertical along the upper portions, and may have non-vertical excess material at the interface of the photoresist mask and the underlying substrate. Such excess material may be referred to as foot regions at the base of the photoresist mask. The foot regions complicate subsequent utilization of the mask, regardless of whether the mask is utilized to pattern an etch or is utilized for patterning a dopant implant.

It is desired to develop methods for treating photoresist masks which remove the foot regions.

DETAILED DESCRIPTION OF THE ILLUSTRATED EMBODIMENTS

In some embodiments, a dry trim process is utilized to control and/or remove a foot region from a patterned photoresist mask. Such removal may be accomplished utilizing concentration of ions proximate sidewalls of the photoresist mask. In some embodiments, the photoresist mask is formed over a first material, and trenches are formed in the first material adjacent sidewalls of the photoresist mask as the foot regions are removed. Subsequently, a second material may be deposited adjacent the sidewalls and with projections extending into the trenches. Such projections may assist in anchoring the second material to the first material.

Example embodiments are described with reference to FIGS. 1-14.

Figure 1:
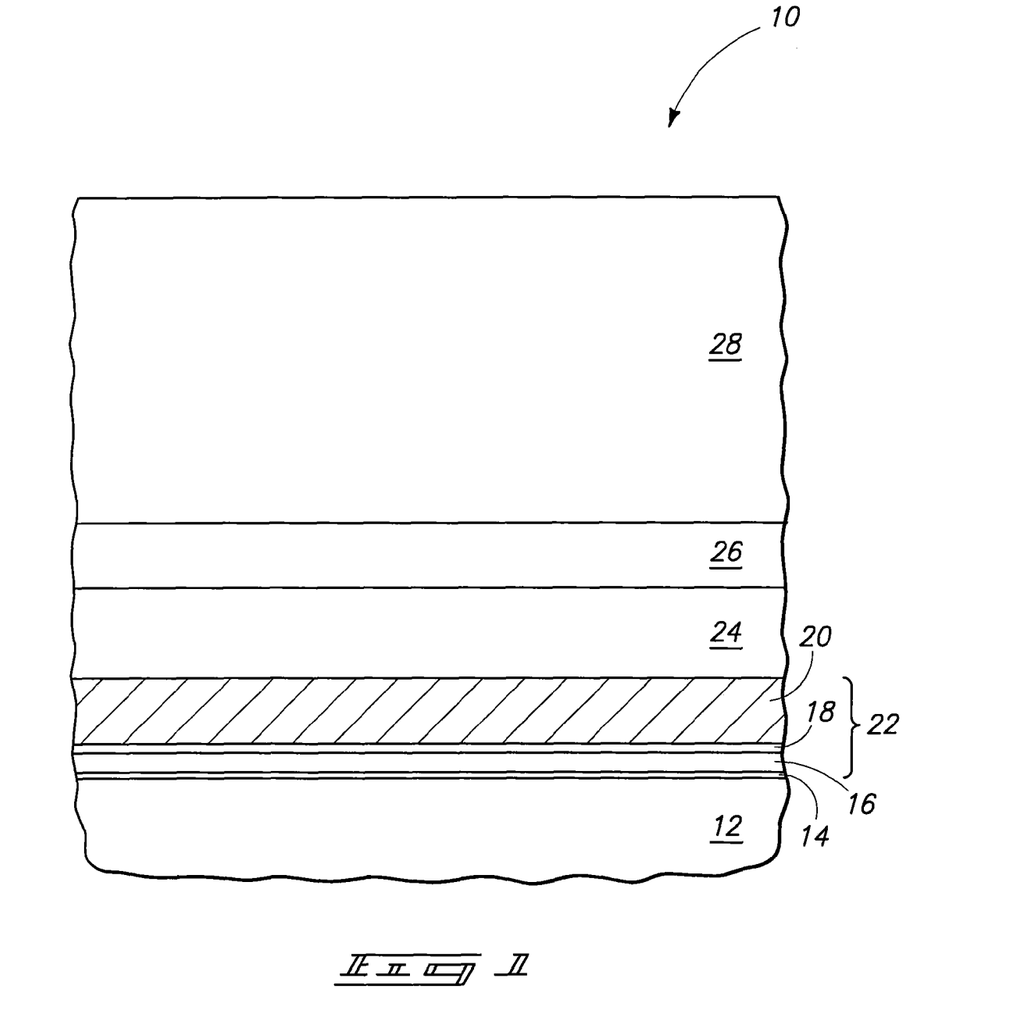
FIGS. 1-3 show diagrammatic cross-sectional views of a fragment of a semiconductor construction, and illustrate process stages during photolithographic processing in accordance with an example embodiment.

Referring initially to FIG. 1, such shows a semiconductor construction 10 at a process stage during fabrication of flash memory devices. Construction 10 comprises a base semiconductor material 12. The base semiconductor material may comprise, consist essentially of, or consist of silicon; and may, for example, correspond to monocrystalline silicon lightly background doped with p-type dopant. Base semiconductor material 12 may be considered a semiconductor substrate or a portion of a semiconductor substrate. To aid in interpretation of the claims that follow, the teens "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous layers in some embodiments. For instance, base 12 may correspond to a semiconductor substrate containing one or more layers associated with integrated circuit fabrication. In such embodiments, such layers may correspond to one or more of metal interconnect layers, barrier layers, diffusion layers, insulator layers, etc.

Tunnel dielectric 14 is formed over base 12. The tunnel dielectric may comprise any suitable composition or combination of compositions; and may, for example, comprise, consist essentially of, or consist of silicon dioxide.

A charge-retaining material 16 is formed over tunnel dielectric 14. The charge-retaining material may comprise a floating gate (for instance, polycrystalline silicon) or may comprise charge-trapping material (for instance, silicon nitride). Although the charge-retaining material is shown to be homogeneous, in some embodiments it may comprise multiple different compositions, such as, for example, nanodots embedded within dielectric material.

A blocking dielectric 18 is over the charge-retaining material. The blocking dielectric may comprise any suitable composition or combination of compositions; and may, for example, comprise, consist essentially of, or consist of one or more of silicon nitride, silicon dioxide, or any of various high-k materials (with high-k materials being materials having a dielectric constant greater than that of silicon dioxide).

Control gate material 20 is formed over the blocking dielectric. The control gate material may comprise any suitable composition or combination of compositions; and may, for example, comprise, consist essentially of, or consist of one or more of various metals, metal-containing compositions, and conductively-doped semiconductor materials.

The tunnel dielectric 14, charge-retaining material 16, blocking dielectric 18 and control gate material 20 may be together considered a gate stack 22, in that the layers may ultimately be patterned into flash memory gates.

A patterning mask material 24 is formed over gate stack 22. The patterning mask material may be a carbon material, and may, for example, comprise, consist essentially of, or consist of amorphous carbon.

A hard masking material 26 is formed over material 24. The hard masking material may correspond to a deposited antireflective coating (DARC); and may thus comprise, consist essentially of, or consist of silicon oxynitride. DARC is an example material 26, and material 26 may comprise other compositions in other embodiments (the composition of material 26 may be electrically insulative, electrically conductive, or semiconductive, depending on the application).

Material 28 is deposited over hard masking material 26. Material 28 may comprise, consist essentially of, or consist of photoresist in some embodiments, and may be referred to as photoresist in some of the embodiments described herein.

As discussed above, the term "semiconductor substrate" may describe constructions which include semiconductor material in combination with various layers and structures. Accordingly, the base 12, gate stack 22, carbon material 24 and hard masking material 26 may be together considered to be a semiconductor substrate in some embodiments.

Figure 2:
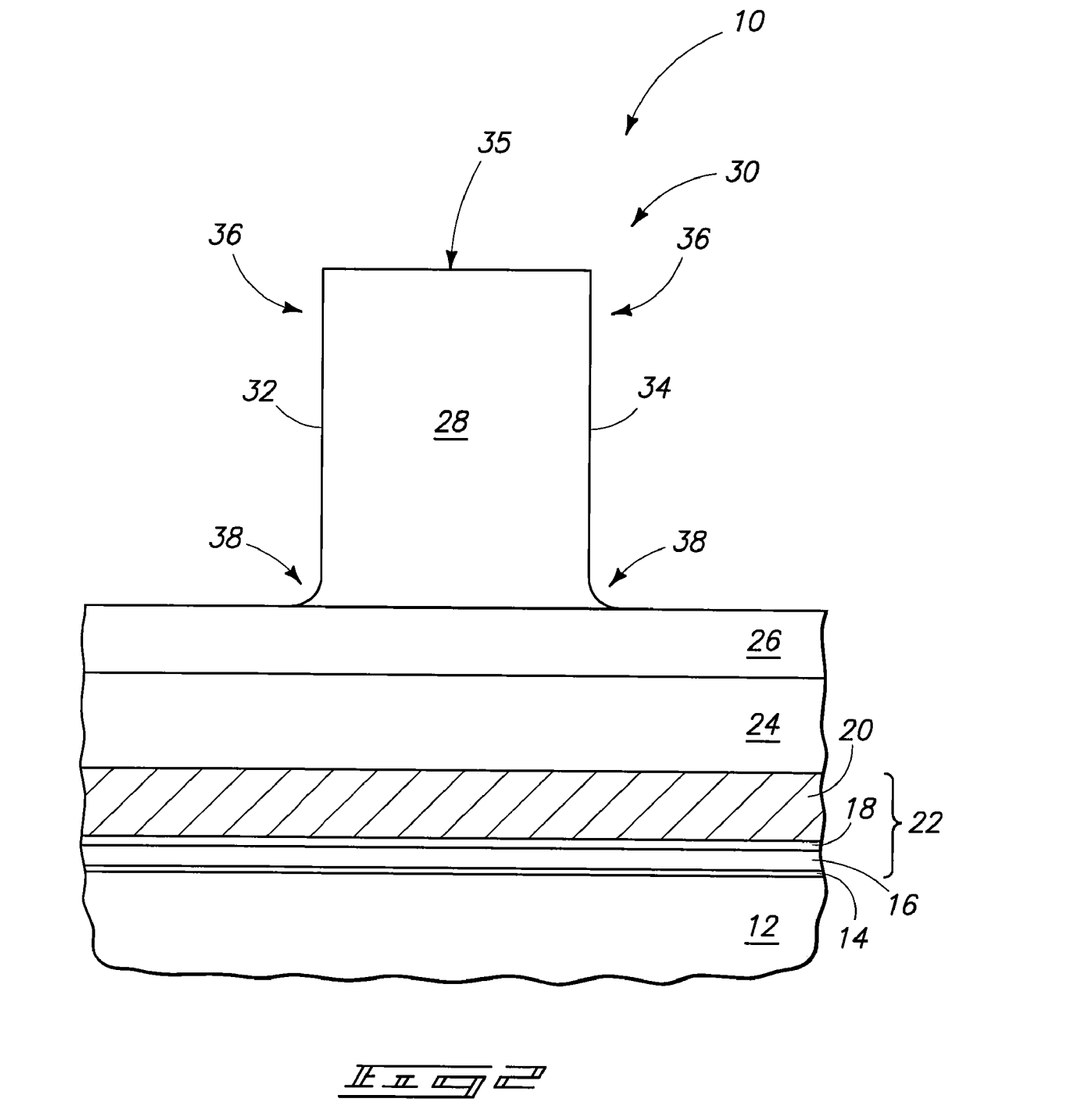

Referring to FIG. 2, photoresist 28 is photolithographically patterned to form a patterned masking structure 30 from the photoresist. Structure 30 may be referred to as a patterned photoresist mask, or alternatively as a patterned feature. The patterned photoresist mask comprises, in the shown cross-sectional view, a pair of opposing sidewalls 32 and 34, and an upper surface 35 extending between the sidewalls.

The sidewalls 32 and 34 extend upwardly from an uppermost surface of hard masking material 26. The sidewalls comprise upper regions 36 which are substantially vertical (i.e., orthogonal relative to a planar upper surface of material 26), and comprise lower regions 38 which are non-vertical. The lower regions may be referred to as foot regions. The foot regions are generally undesired, and result from difficulties and problems during photolithographic processing and development. The foot regions may be considered excess photoresist material remaining at the interface of the patterned photoresist mask with the underlying layer 26. Ideally, the sidewalls 32 and 34 would extend vertically along the entire distance from the interface with underlying material 26 to the upper surface 35, rather than having the foot regions 38. Some embodiments include methods which may be utilized to either entirely remove the foot regions, or to control a shape of the foot regions.

Figure 3:
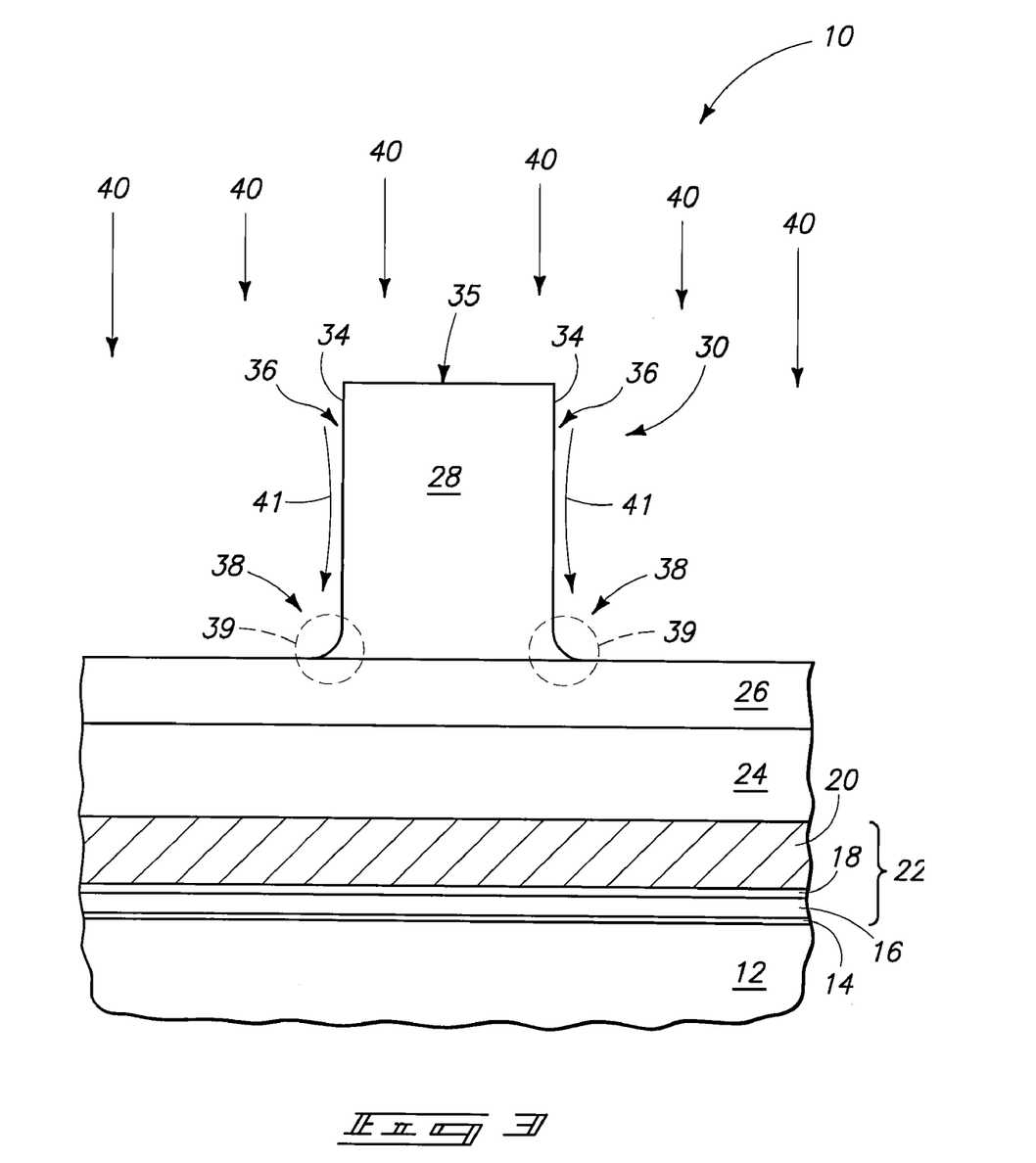

Referring to FIG. 3, construction 10 is exposed to etching conditions which remove some of the photoresist mask 30. Such etching conditions may lower the height of the mask (in other words, reduce the distance between upper surface 35 and the upper surface of layer 26), and also may reduce the lateral thickness of the photoresist mask (in other words, reduce the distance between sidewalls 32 and 34). The etching conditions are shown to comprise ions 40 directed downwardly at the photoresist mask. The ions are primarily normally directed, but have some amount of lateral velocity. Therefore, some of the ions graze the vertical regions 36 of the sidewalls, as illustrated by the grazing ions 41 in FIG. 3. Such grazing ions may reflect from the vertical regions of the surfaces and thereby be directed toward the foot regions 38. This may cause the foot regions to be subjected to more etching than other regions of the photoresist mask, which may cause more rapid removal of the foot regions than other regions of the photoresist mask. Areas having some etching due to the reflections are diagrammatically illustrated as regions 39 in FIG. 3. The regions 39 having additional ion etching may be referred to as areas where some ion focusing occurs.

Figure 4:
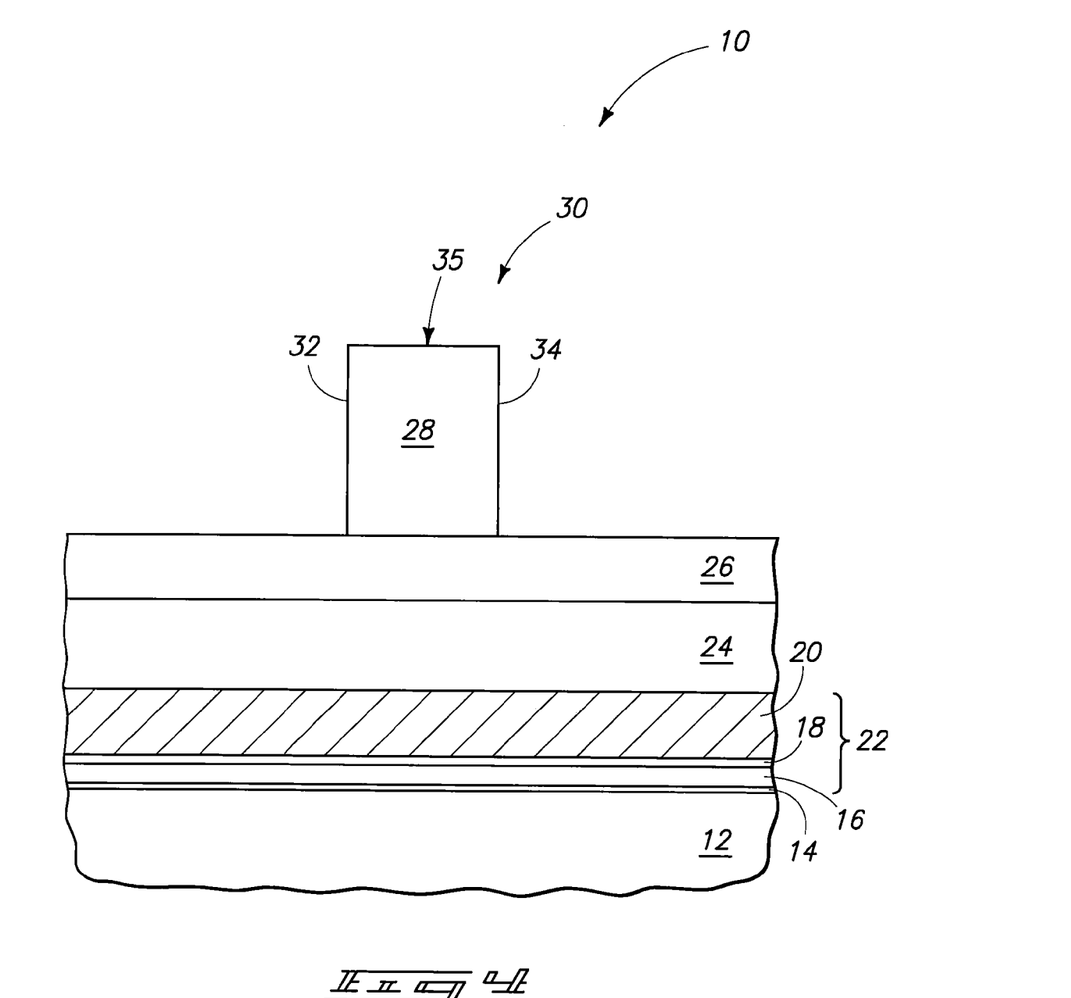
FIG. 4 shows the fragment of FIGS. 1-3 at a process stage subsequent to that of FIG. 3.

The rapid removal of material from regions 39 may ultimately result in removal of at least the majority of the excess material of the foot regions, which may modify the sidewalls 32 and 34 so that they now extend vertically all the way to the upper surface of material 26 (as shown in FIG. 4).

The concentration (or focusing) of ions into regions adjacent the vertical sidewalls may be considered microtrenching (or alternatively, profile trenching). Two mechanisms that have been proposed to explain microtrenching are: (1) that specular ion scattering occurs from sidewall surfaces at grazing incidence, and (2) that ion deflection occurs due to differential charging of microstructures. In the prior art, microtrenching is a problem which is to be avoided during semiconductor fabrication. Some embodiments of the present invention utilize the prior art problem of microtrenching for benefit during patterning of masking features.

Some example conditions that may be utilized to induce ion focusing during patterning of feature 30 are as follows. A bias may be from about 100 volts to about 1000 volts (for instance, from about 150 volts to about 400 volts), a treatment time may be from about five seconds to about two minutes (for instance, from about 10 seconds to about 30 seconds), a pressure within a treatment chamber may be less than atmospheric (for example, may be about 10 millitorr), and the ions may be formed from any gases that isotropically etch material of feature 30. For instance, if feature 30 consists of photoresist, the ions may be formed from oxygen and/or hydrofluorocarbons and/or halogen-contain materials and/or $N_2$.

Referring to FIG. 4, construction 10 is shown after sufficient etching to reduce a width of photoresist mask by about one-half, and to substantially entirely remove foot regions 38 (FIG. 2). The entirety of sidewalls 32 and 34 extend vertically from the interface with material 26 to the upper surface 35 of masking feature 30 at the processing stage of FIG. 4. Accordingly, the etching of FIG. 3 may be considered to have extended the verticality of the upper regions 36 (FIG. 2) of the sidewalls to the lower regions 38 (FIG. 2) of the sidewalls.

Figure 5:
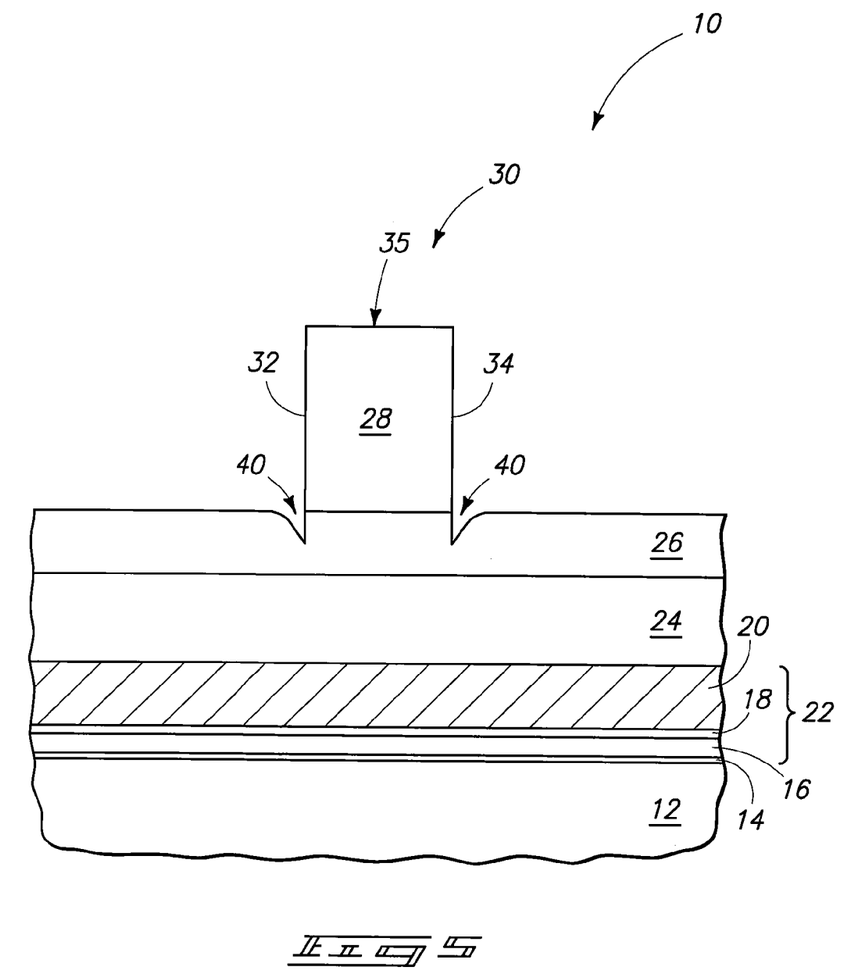
FIG. 5 shows the fragment of FIGS. 1-3 at a process stage subsequent to that of FIG. 3 in accordance with another embodiment.

The construction of FIG. 4 illustrates one embodiment for patterning a mask. Another embodiment is shown in FIG. 5. The embodiment of FIG. 5 shows trenches (or cavities) 40 formed into hard masking material 26 by the ion reflections utilized to remove the foot regions 38 (FIG. 2). The trenches 40 are at the bases of sidewalls 32 and 34, and may be considered to be formed along the vertical sidewalls, or may be considered to be extensions of the vertical regions of the sidewalls into the material 26. In the shown embodiment, the trenches extend only part of the way through material 26.

In subsequent processing, patterned mask 30 is utilized for imparting a pattern to the gate stack 22. The processing for utilizing the patterned mask to impart such pattern may be the same regardless of whether the processing initiates from the construction of FIG. 4 (in other words, initiates from a construction lacking trenches adjacent the mask), or initiates from the construction of FIG. 5 (in other words, initiates from a construction having trenches adjacent the mask). However, the trenches of FIG. 5 may provide some advantages, as discussed below. FIGS. 6-11 describe patterning of the gate stack relative to the embodiment initiating from the construction of FIG. 5. The invention includes an analogous embodiment in which similar patterning may be conducted initiating from the construction of FIG. 4.

Figure 6:
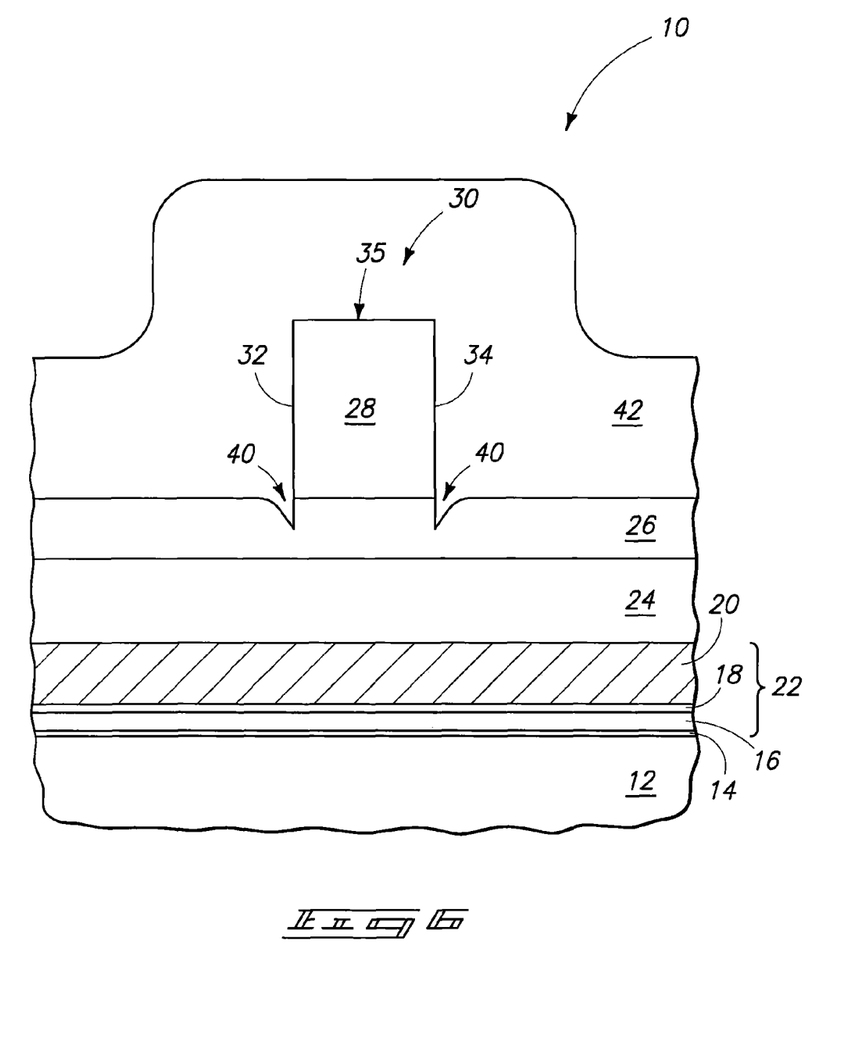
FIGS. 6-11 show the fragment of FIG. 5 at process stages subsequent to that of FIG. 5.

Referring to FIG. 6, a sacrificial material 42 is formed over patterned mask 30 and within cavities 40. Sacrificial material 42 may comprise any suitable composition or combination of compositions, and may, for example, comprise, consist essentially of, or consist of silicon dioxide or silicon nitride.

Figure 7:
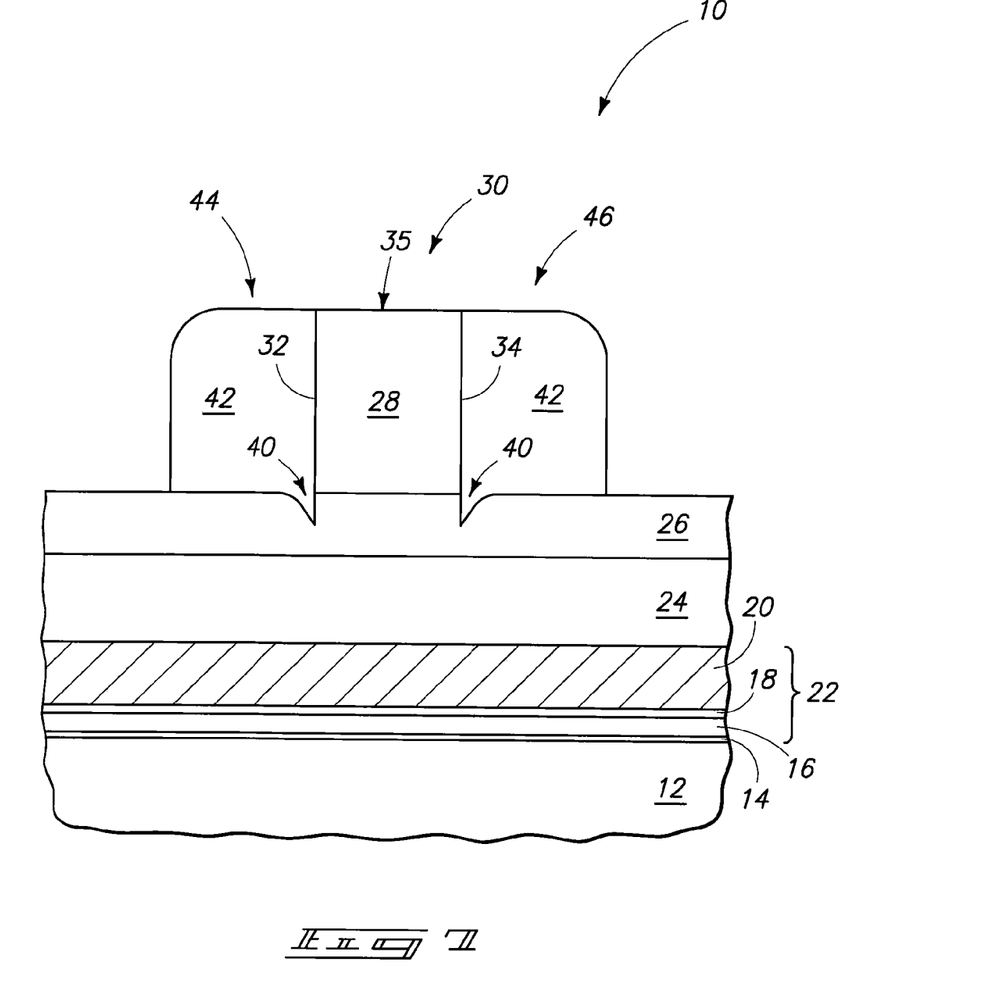

Referring to FIG. 7, sacrificial material 42 is anisotropically etched to form the material into a pair of masking structures 44 and 46 on opposing sides of mask 30. The masking structures 44 and 46 are along the opposing sidewalls 32 and 34 of the patterned mask, respectively.

Figure 8:
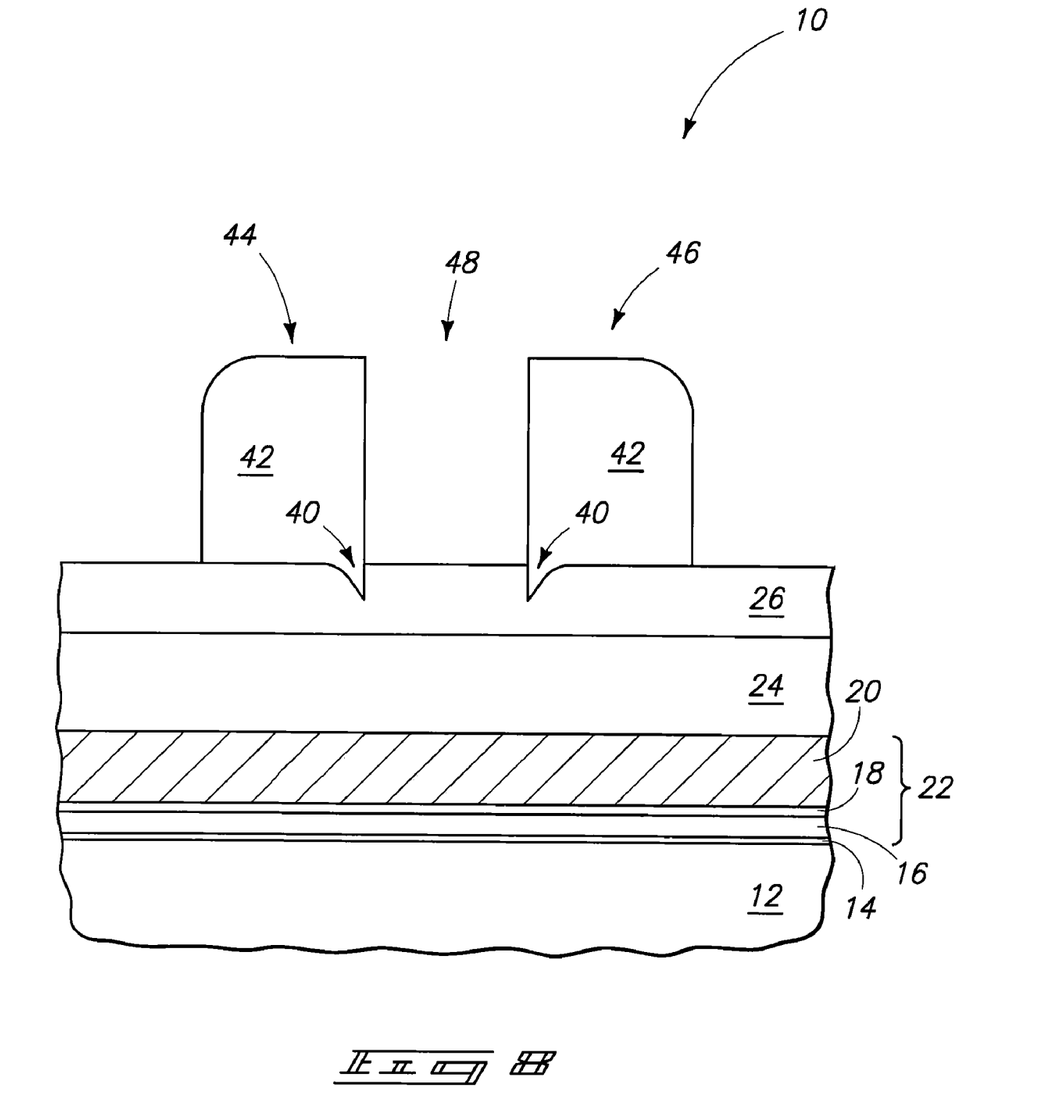

Referring to FIG. 8, patterned mask 30 (FIG. 7) is removed to leave a gap 48 between the masking structures 44 and 46. The masking structures 44 and 46 have projections of material 42 extending into layer 26 (the portions of material 42 within cavities 40), and such projections may assist in anchoring material 42 to material 26. This is an advantage of utilizing the embodiment of FIG. 5 that had the cavities 40, relative to utilizing the embodiment of FIG. 4 that lacked such cavities.

The masking structures 44 and 46 are formed at higher density than the original photoresist pattern, and in some embodiments the process of replacing the photoresist masking structure with the masking structures 44 and 46 may be a method for halving the pitch between masking structures (or doubling the number of masking structures across a unit area).

Figure 9:
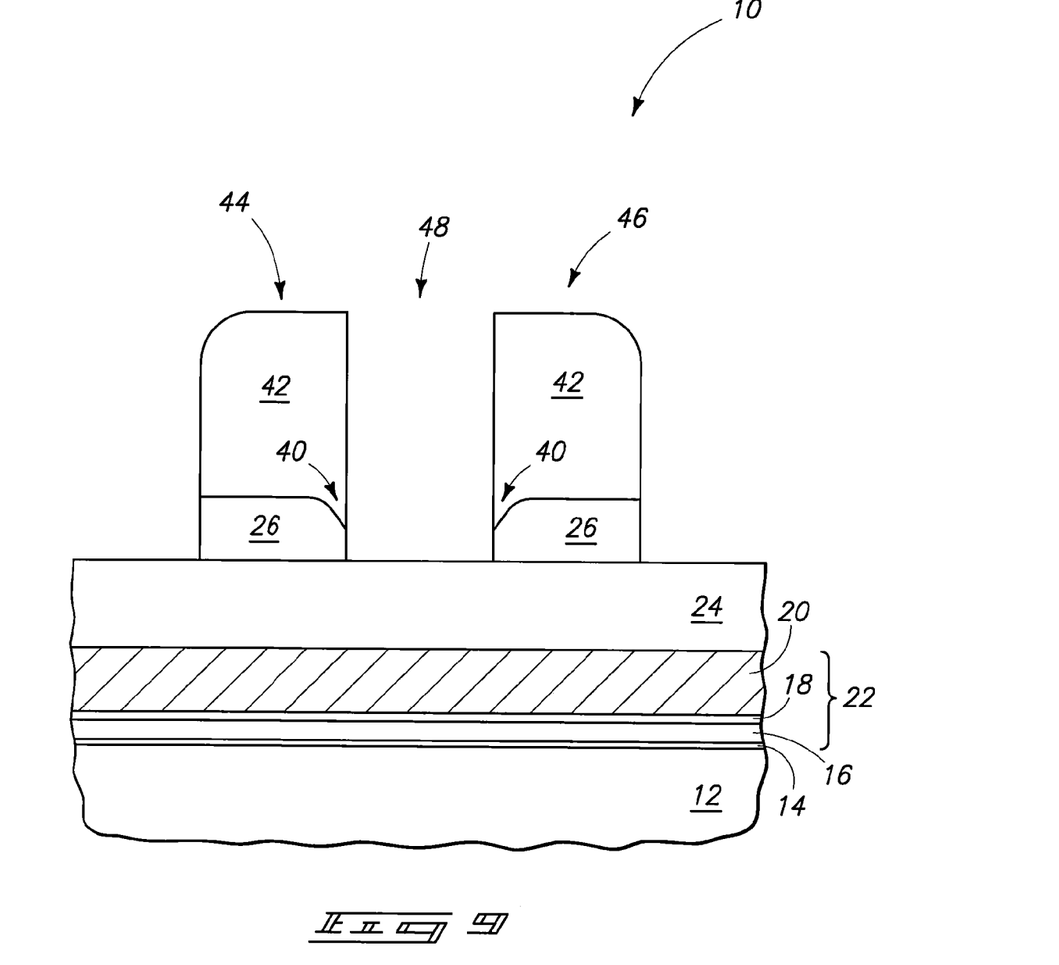

Referring to FIG. 9, the pattern of masking structures 44 and 46 is transferred into layer 26 with an etch of the material of layer 26.

Figure 10:
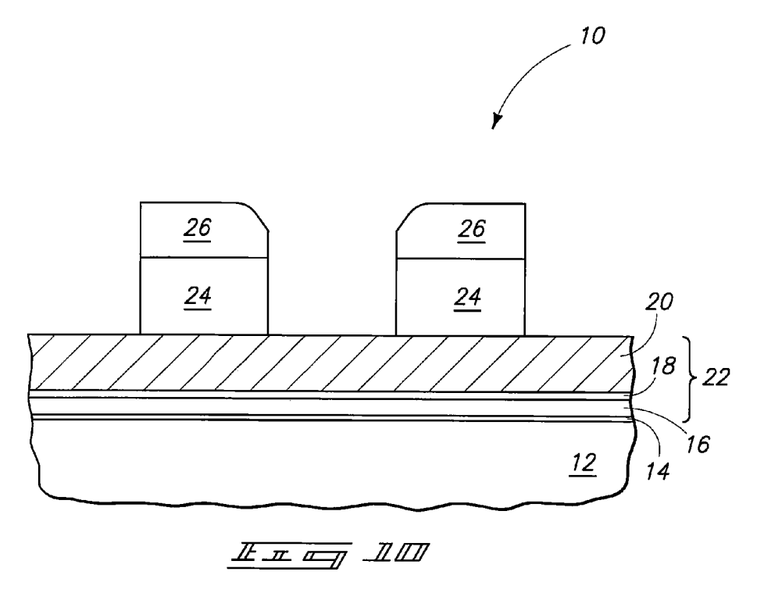

Referring to FIG. 10, sacrificial material 42 (FIG. 9) is removed, and the pattern of hard masking material 26 is transferred into carbon material 24 with an etch.

Figure 11:
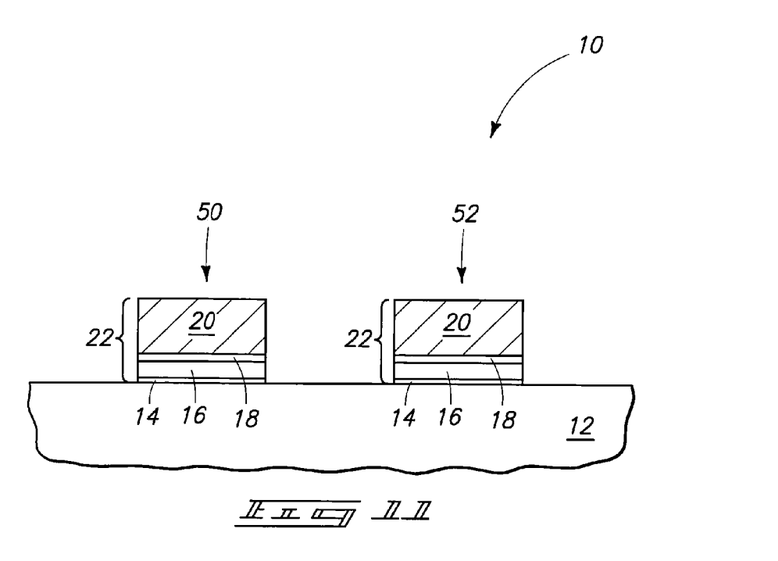

Referring to FIG. 11, the pattern of carbon material 24 (FIG. 10) is transferred into gate stack 22 with one or more suitable etches, and materials 24 and 26 (FIG. 10) are removed. Such forms the gate stacks into gates 50 and 52 which may then be incorporated into flash memory cells.

Figure 12:
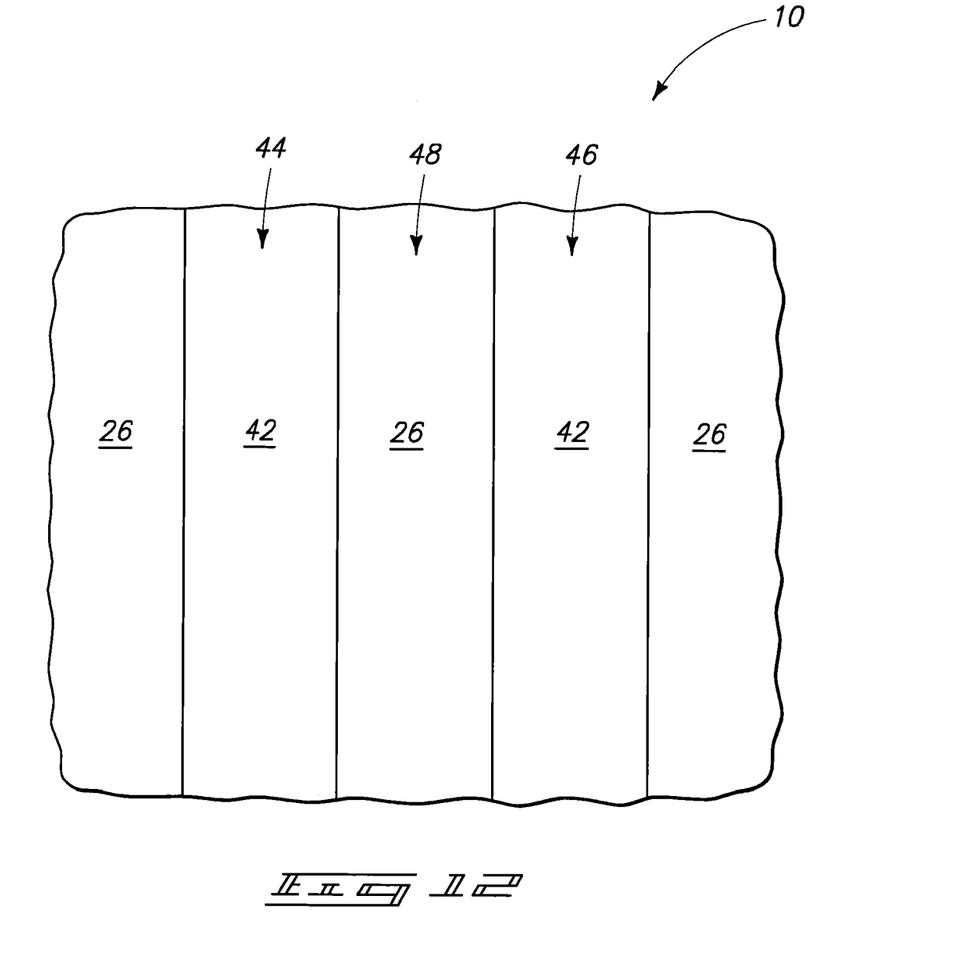
FIG. 12 shows a top view of the fragment of FIG. 8.
Figure 13:
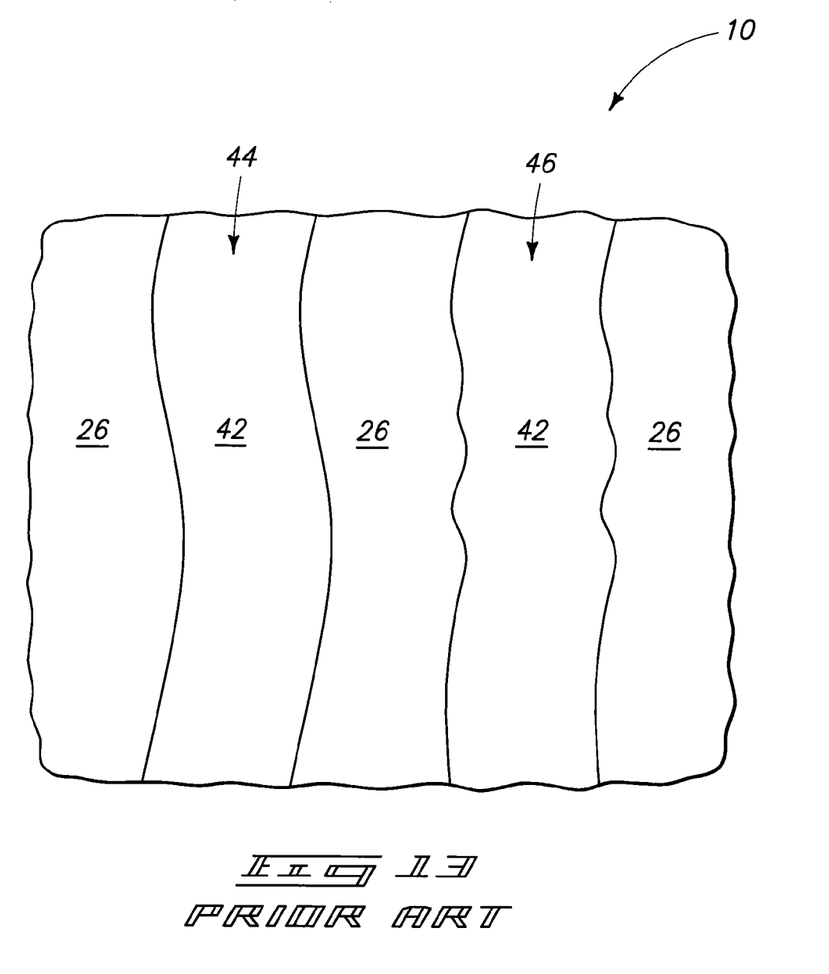
FIG. 13 shows a top view of a prior art fragment at a process stage analogous to that of FIG. 12.

FIGS. 12 and 13 illustrate an advantage that may be obtained utilizing some embodiments relative to the prior art. FIG. 12 shows a top view of construction 10 at the processing stage of FIG. 8, and FIG. 13 shows a top view of a prior art construction at a similar processing stage. The patterned masks 44 and 46 are lines extending across material 26, and in the embodiment of FIG. 12 such lines are straight and parallel with one another. In contrast, in the prior art construction of FIG. 13 similar lines 44 and 46 serpentine across surface 26 and do not remain parallel with one another. The reason that the prior art lines of FIG. 13 serpentine is due to the foot regions 38 (FIG. 2) having not been removed in prior art processing, so that the lines 44 and 46 wobble on such foot regions and shift on material 26 due to instability induced by such wobbling. The embodiment of FIG. 12 eliminated the wobbling by removing the foot regions. In embodiments in which masking materials 44 and 46 have projections anchored in cavities (for instance, the projections anchored in cavities 40 of FIG. 8), such anchoring can further assist in alleviating shifting of the masking materials on a surface of material 26.

Figure 14:
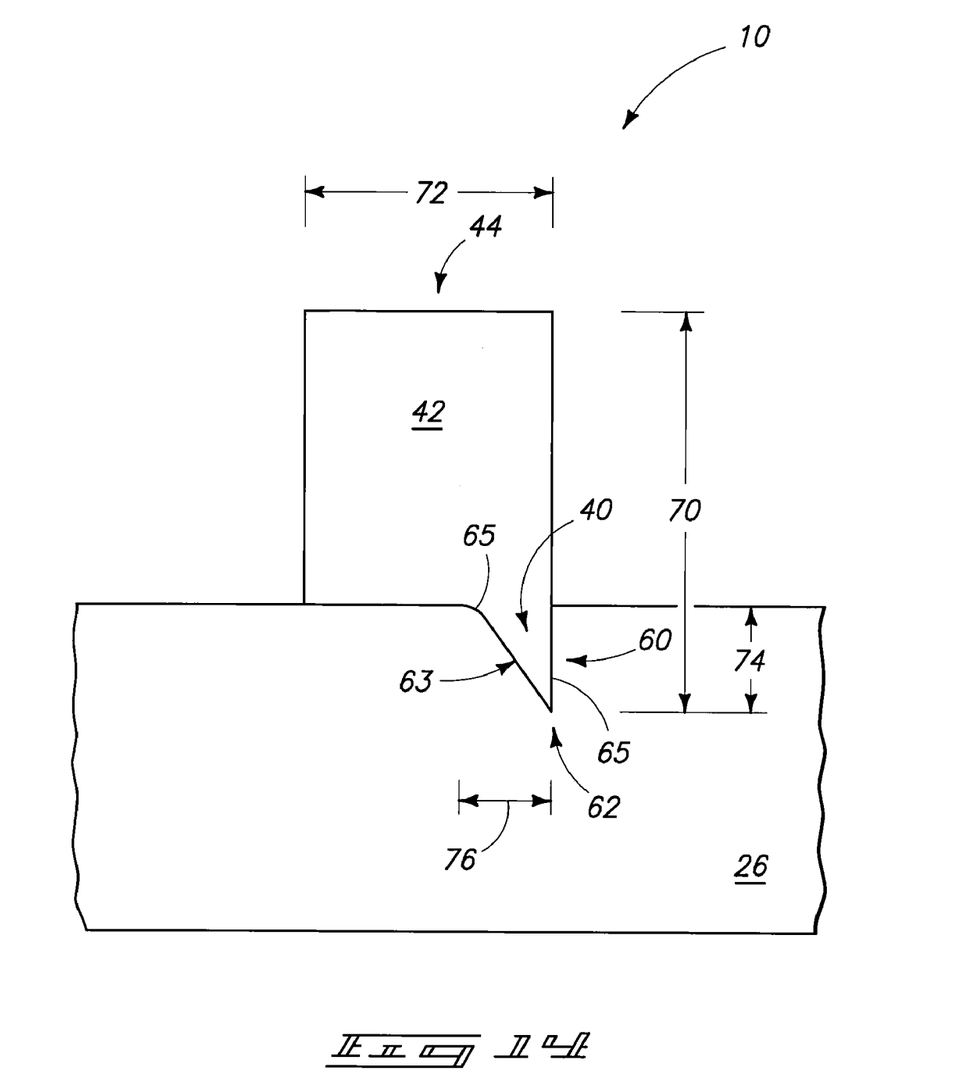
FIG. 14 shows a diagrammatic, cross-sectional view of a fragment of a semiconductor construction in accordance with an embodiment.

FIG. 14 shows an enlarged view of masking structure 44 and underlying material 26 at the processing stage of FIG. 8. The masking structure is shown to comprise a projection of material 42 within cavity 40. Such projection is generally indicated by the label 60. The projection has a pointed bottom region 62 and a pair of sidewalls 63 and 65 extending upwardly from such pointed bottom region. The sidewall 65 is substantially vertical, while the sidewall 63 is angled away from vertical and extends to a curved region 65. The projection 60 is shaped somewhat like a fang, and accordingly may be referred to as a fang-like projection.

The size of the projection may be controlled by the conditions utilized during the patterning of FIG. 3. The masking structure 44 may be considered to comprise a total (or overall) height extending from the lowermost surface of the fang to the top surface of the masking structure, with such height being indicated by the label 70 in FIG. 14. The masking structure may also be considered to comprise a lateral width extending from one of the sidewalls in the shown cross-sectional view to the other of the sidewalls, with such lateral width being indicated by the label 72 in FIG. 14. The fang-like projection has a height from the lowermost surface of the projection to the top surface of material 26, with such height being labeled 74 in FIG. 14. The fang-like projection also has a lateral width, with such with being labeled 76 in FIG. 14. In some embodiments, the height of the fang-like projection may be from about five percent to about 50 percent of the total overall height of the masking structure 44; and the width of the projection may be from about five percent to about 100 percent of the total width of the masking structure.

Although the embodiments described above are for removing foot regions proximate photoresist, in other embodiments analogous processing may be utilized to remove foot regions adjacent other materials. Also, although the embodiments illustrate anchoring sacrificial materials onto other materials through the illustrated fang-like projections, in other embodiments materials which are not sacrificial may be anchored through analogous fang-like projections.

Although example embodiments are describe above with reference to formation of flash memory, in other embodiments the methods described herein may be utilized during fabrication of other structures. The methods may be particularly useful during fabrication of constructions having regular line and space features, such as, for example, other memory arrays (for instance, dynamic random access memory (DRAM) arrays).

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A semiconductor construction, comprising:
   a semiconductor substrate;
   a plurality of structures over the substrate and joined to the substrate through fang-like projections that extend into the substrate; and wherein:
   the substrate comprises a semiconductor base and a gate stack over the semiconductor base; the gate stack including in ascending order from the semiconductor base, tunnel dielectric, charge-retaining material, blocking dielectric, and control gate material; the substrate further comprising carbon material over the control gate material, and hard masking material over the carbon material;
   the fang-like projections extend partially into the hard masking material, but not entirely through the hard masking material; and
   the structures comprise lines formed over the hard masking material.

2. The construction of claim 1 wherein the hard masking material consists of silicon oxynitride, and wherein the structures consist of silicon dioxide or silicon nitride.

3. The construction of claim 2 wherein the structures are arranged in pairs, with paired structures being spaced from one another by photoresist-containing features that are directly against the structures.

4. The construction of claim 1 wherein an individual structure has a total height from a lowermost region of a fang-like projection to an uppermost surface of the structure; and wherein the fang-like projection comprises from about 5% to about 50% of said total height.

5. The construction of claim 1 wherein an individual structure has a lateral width; and wherein the fang-like projection comprises from about 5% to about 100% of said lateral width.

6. The construction of claim 1 wherein:
   an individual structure has a total height from a lowermost region of the fang-like projection to an uppermost surface of the structure;
   the fang-like projection comprises from about 5% to about 50% of said total height;
   an individual structure has a lateral width; and
   the fang-like projection comprises from about 5% to about 100% of said lateral width.

7. A semiconductor construction, comprising:
   a semiconductor base;
   a gate stack over the semiconductor base; the gate stack including in ascending order from the semiconductor base, tunnel dielectric, charge-retaining material, blocking dielectric, and control gate material;
   carbon material over the control gate material;
   hard masking material over the carbon material;
   a line of masking material over the hard masking material;
   a pair of masking structures, the masking structures being on opposing sides of the line from one another and being directly against the line; the masking structures being of a different composition than the line of masking material;
   the masking structures being over and directly against the hard masking material and having fang-like projections adjacent the line and extending into the hard masking material.

8. The construction of claim 7 wherein the line of masking material consists of photoresist, and wherein the masking structures consist of silicon dioxide or silicon nitride.

9. The construction of claim 8 wherein the hard masking material consists of silicon oxynitride.

* * * * *